US00RE45280E

(19) United States
(12) Reissued Patent
Gates

(10) Patent Number: US RE45,280 E
(45) Date of Reissued Patent: Dec. 9, 2014

(54) SEGMENTED COIL FOR GENERATING PLASMA IN PLASMA PROCESSING EQUIPMENT

(75) Inventor: Duane Charles Gates, Danville, CA (US)

(73) Assignee: Lam Research Corporation, Fremont, CA (US)

(21) Appl. No.: 09/534,814

(22) Filed: Mar. 22, 2000

Related U.S. Patent Documents

Reissue of:
(64) Patent No.: 5,731,565
Issued: Mar. 24, 1998
Appl. No.: 08/507,971
Filed: Jul. 27, 1995

(51) Int. Cl.
*B23K 10/00* (2006.01)
*H05H 1/30* (2006.01)

(52) U.S. Cl.
CPC ..... *H05H 1/30* (2013.01)
USPC ..... 219/121.54; 219/121.43; 219/121.52; 156/345.44; 156/345.47; 315/111.51

(58) Field of Classification Search
CPC ..... H05H 1/30; B23K 10/00
USPC ..... 219/121.4, 121.41, 121.44, 121.43, 219/121.54, 121.57, 121.52; 118/723 I, 118/723 R; 204/298.38, 298.37; 315/111.21, 111.51; 156/643.1, 646.1, 156/345, 345.23, 345.44, 345.46, 345.48, 156/345.49
See application file for complete search history.

(56) References Cited

U.S. PATENT DOCUMENTS

| | | | | | |
|---|---|---|---|---|---|
| 3,586,905 | A | * | 6/1971 | Bignell | 219/121.36 |
| 4,615,755 | A | | 10/1986 | Tracy et al. | |
| 4,948,458 | A | | 8/1990 | Ogle | |
| 5,198,718 | A | | 3/1993 | Davis et al. | |
| 5,261,962 | A | | 11/1993 | Hamamoto et al. | |
| 5,304,279 | A | | 4/1994 | Coultas et al. | |
| 5,401,350 | A | | 3/1995 | Patrick et al. | 156/345 |
| 5,433,812 | A | | 7/1995 | Cuomo et al. | 156/345 |
| 5,525,159 | A | * | 6/1996 | Hama et al. | 118/723 I |
| 5,690,781 | A | * | 11/1997 | Yoshida et al. | 156/345 |
| 5,716,451 | A | * | 2/1998 | Hama et al. | 118/723 I |
| 5,731,565 | A | * | 3/1998 | Gates | 219/121.54 |
| 6,028,395 | A | * | 2/2000 | Holland et al. | 315/111.51 |

FOREIGN PATENT DOCUMENTS

EP 0 517 042 A1 12/1992

* cited by examiner

*Primary Examiner* — Mark Paschall
(74) *Attorney, Agent, or Firm* — Martine Penilla Group, LLP

(57) ABSTRACT

A segmented transformer coupled plasma (TCP) coil is provided as a source for generating a uniform plasma in a plasma reactor. The segmented TCP is divided into two or more segment coils which, when connected to an RF source, produces a circulating flow of electrons to cause a magnetic field in the plasma. Because the segmented TCP employs multiple segment coils, a plasma is generated that is more spatially uniform than the plasma produced by a monolithic coil. This is implemented using a power distributing component that allows the RF current to be distributed in the segment coils such that a uniform plasma density can be obtained in an area spanned by the coils. For instance, variable shunts, switchable shunts, and disconnect switches can be used to vary the RF currents in the individual coils.

58 Claims, 3 Drawing Sheets

SEGMENTED COIL FOR GENERATING PLASMA IN PLASMA PROCESSING EQUIPMENT

Matter enclosed in heavy brackets [ ] appears in the original patent but forms no part of this reissue specification; matter printed in italics indicates the additions made by reissue.

BACKGROUND OF THE INVENTION

The present invention relates generally to a segmented coil for a transformer coupled plasma (TCP) source. More specifically, the present invention relates to a segmented coil configuration as a source for generating a plasma which can be used for treating semiconductor wafers in low pressure processing equipment.

Plasma generation is useful in a variety of semiconductor fabrication processes, for example enhanced etching, deposition, etc. Plasmas are generally produced from a low pressure gas by inducing an electron flow which ionizes individual gas molecules through the transfer of kinetic energy through individual electron-gas molecule collisions. The electrons are commonly accelerated in an electric field, typically a radio frequency (RF) electric field.

Numerous techniques have been proposed to accelerate the electrons in an RF electric field. For example, U.S. Pat. No. 4,948,458 discloses a plasma generating device in which electrons are excited in an RF field within a chamber using a single winding coil (SWC) that is parallel to the plane of a semiconductor wafer and the plasma. As shown in FIG. 1, a typical plasma generating device includes RF circuitry comprising an RF source 30 coupled via a coaxial cable 32 through an impedance matching circuit to an SWC 20. The impedance matching circuitry includes a loop 34 and a coil 36. A tuning capacitor 38 is also provided as part of the RF circuitry to adjust the circuit resonant frequency to the RF driving frequency. A process gas is introduced into a chamber 10, and an RF current produced by the RF source 30 is resonated through the SWC 20, causing a planar magnetic field. The magnetic field causes a circulating flow of electrons between the coil 20 and the wafer W which is supported by a surface 40, generating a plasma in the chamber 10.

A typical SWC is shown in detail FIG. 2. The SWC 20 comprises a singular conductive element formed into a planar spiral or a series of connected concentric rings. The SWC 20 includes an inner tap, i.e. terminal, labeled (+) and an outer tap, i.e. terminal, labeled (−) so that it can be connected to the RF circuitry. Hence, coil 20 includes an inner terminal, an outer terminal and an arcuate conductor portion having at least one turn connected between the inner and outer terminals.

When processing semiconductor wafers in plasma gas environments, it is desirable to uniformly process the entire surface of the wafer. The single winding monolithic coil, such as that described, above does not provide the same uniformity at all operating pressures. For example, at one pressure the center of the wafer may be etched at a higher rate than remaining portions of the wafer while at another pressure the center of the wafer may be etched at a lower rate than remaining portions of the wafer. Other process parameters, such as RF power, gas species and flows, may also affect the rate at which the center is etched.

Several methods have been proposed to optimize plasma uniformity. For example, U.S. Pat. No. 4,615,755 discloses a plasma etching technique wherein uniformity of the wafer temperature is achieved by He backcooling of a wafer supported on a bowed electrode. By bowing the wafer away from the lower electrode with the cooling helium, cooling performance of the wafer is sacrificed in order to achieve etch uniformity. However, variations in the thickness of the wafer result in sub-standard control of the wafer bowing, thereby reducing the etch uniformity.

Another proposed solution for optimizing plasma uniformity is to adjust the process parameters. A problem with this proposed solution is that once process parameters are adjusted to obtain uniformity, only a small parameter range is typically available for optimizing other etch responses, such as profile.

Yet another proposed solution for optimizing plasma uniformity is to modify the reactor configuration by shaping the plasma window or by adding shrouds, spacers, or focus rings. The disadvantage of this approach is that such modifications are fixed and work best in a limited parameter range.

There is thus a need for a plasma generating coil that optimizes plasma uniformity but does not limit the parameter ranges needed for optimizing other etch responses.

SUMMARY OF THE INVENTION

The invention provides an apparatus for generating a transformer coupled plasma (TCP), the apparatus comprising a plasma reaction chamber into which a process gas is introduced, a coil comprising at least a first coil segment and a second coil segment connected in series and disposed proximate the chamber, and a radio frequency source coupled via RF circuitry to the segmented coil. The radio frequency source resonates a radio frequency current in the segmented coil and excites the process gas into a plasma within the chamber. Variable electrical components are connected across or between the first and second coils to selectively change the RF current in each segment coil relative to the other segments. The variable electrical components permit the segment coil currents to be adjusted to improve the spatial uniformity of RF power coupling in the plasma, thereby improving the plasma and process uniformity such as etching, deposition, etc., in the reaction chamber.

Preferably, each of the coil segments has an inner terminal, an outer terminal and an arcuate conductor portion having at least one turn extending between the inner and outer terminals.

According to various aspects of the invention, the variable electrical components have different configurations. For instance, an adjustable capacitor or a switch can be connected across a segment of the coil to shunt that segment from the rest of the segments. Alternatively, a switch can be connected in series between one segment and another to disconnect one of the segments from the RF circuitry.

The invention also provides a method of generating a transformer coupled plasma, the method comprising the steps of introducing a process gas into a plasma reaction chamber and resonating a radio frequency current in a coil comprising at least a first coil segment and a second coil segment connected in series and disposed proximate the chamber. The RF current excites the process gas into a plasma within the chamber. The method further comprises a step of varying the radio frequency current in each of the segments to improve the spatial uniformity of RF power coupling in the plasma and in turn improve the plasma and process uniformity such as etching, deposition, etc., in the reaction chamber.

The method is preferably carried out using the various a coil configuration as previously mentioned. Further, the plasma can be used to process one or more substrates such as semiconductor wafers. For instance, the reaction chamber can be sized to process a single semiconductor wafer at a time and a layer on the wafer can be etched or deposited by the plasma. During processing, the chamber is typically maintained at a wide range of pressures, such as less than 100 mTorr.

DETAILED DESCRIPTION OF THE PREFERRED EMBODIMENTS

The invention relates to plasma processing of substrates, such as semiconductor wafers, flat panel displays, etc. In the case of processing such substrates, it is usually desired to provide a uniform plasma density above the exposed surface of the substrate to be processed. However, depending on the treatment to be performed on the substrate surface, non-uniform plasma density can occur above the surface. For instance, the plasma density may be greater at the substrate center than at the edge thereof or vice versa. The segmented coil of the present invention enable an adjustable RF current to be provided in each of plural segments of the TCP coil and thus achieve substantial improvement in uniformity compared to previously known coil arrangements.

The invention provides a segmented transformer coupled plasma (TCP) coil segment with at least a first coil and a second coil which, when connected to an RF source, efficiently generates a uniform plasma. Since the segmented TCP coil has multiple coil segments, variable electrical components can be connected to the individual coils, allowing RF current in each segment to be changed relative to the other segments. The current in each segment can thus be adjusted to improve the spatial uniformity of RF power deposition in the plasma and to in turn improve the plasma and etching uniformity in the plasma chamber.

Figure 3:
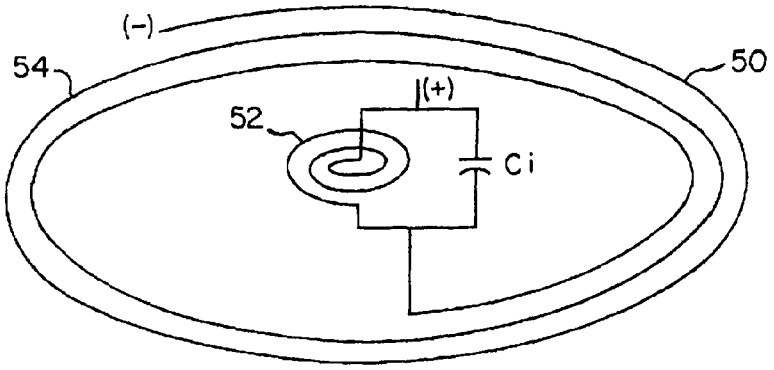
FIG. 3 is a perspective schematic view of a segmented coil configuration according to a first embodiment of the present invention.

FIG. 3 is a schematic drawing of a segmented TCP coil configuration according to a first embodiment of the invention. As shown in FIG. 3, the TCP coil 50 is divided into two concentric coil segments, each including an inner terminal, an outer terminal and at least one arcuate conductor portion extending between the inner and outer terminals. The two concentric coil segments are electrically connected in series with each other and are electrically connected in series to an RF source (not shown). The coil 50 includes a first inner coil segment 52 and a second outer coil segment 54. An inner tap labeled (+), and an outer tap, i.e. terminal, labeled (−) are provided to facilitate connection to the RF circuitry. An adjustable (i.e., variable) capacitor Ci is connected across the first coil 52 segment to reduce or shunt current that would otherwise flow through the first coil. This segmented coil arrangement allows the plasma uniformity to be varied. This is done by changing the value of Ci, which varies the current through the first coil segment 52, which in turn varies the rate plasma is generated in an area in the plasma chamber beneath the coil segment 52. If the value of Ci is high, the capacitor has a low reactive impedance shunting coil 52, so less r.f. current flows through coil 52 and plasma generation in the area beneath coil 52 is reduced while coil 54 continues to generate substantially the same amount of plasma in the area below the coil 54. Conversely, if the value of Ci is low, the capacitor has a high reactive impedance shunting coil 52, so the r.f. current flowing through coil segment 52 is not appreciably reduced so both coil segments 52,54 generate plasma in the areas below them.

The capacitor Ci is not an active element in impedance matching. Further, the capacitance of the capacitor Ci is not intended to be continually adjusted, but rather, the capacitor Ci is preset to a desired value, depending upon the particular process and uniformity required for the substrate undergoing processing.

Figure 4:
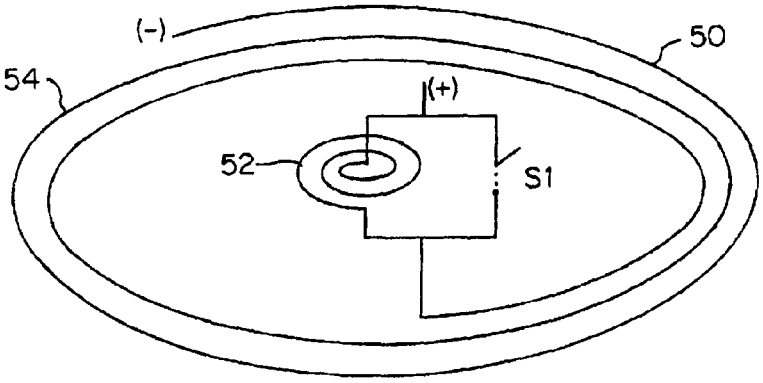
FIG. 4 is a perspective schematic view of a segmented coil configuration according to a second embodiment of the present invention.

A segmented TCP coil according to a second embodiment of the invention is illustrated in FIG. 4. Referring to FIG. 4, instead of shunting the first coil segment 52 with a capacitor Ci, a switch S1 is used to reduce or shunt the current that would otherwise flow through the first coil segment. Using the switch S1, there are two modes of operation. In one mode, the first coil segment 52 and the second coil segment 54 are connected in series when the switch S1 is open and the effects are similar to the FIG. 3 embodiment when the value of Ci is low. In the second mode, the second coil segment 54 is connected in series with a shunted first coil segment 52 when the switch S1 is closed and the effects are similar to the FIG. 3 embodiment when the value of Ci is high.

Figure 5:
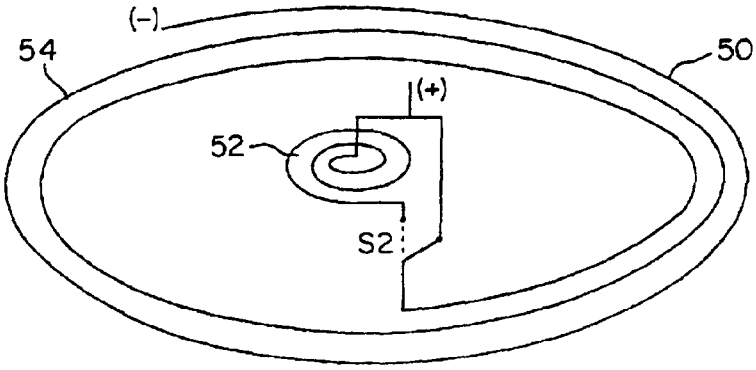
FIG. 5 is a perspective schematic view of a segmented coil configuration according to a third embodiment of the present invention.

FIG. 5 is an illustration of a third embodiment of the segmented TCP coil. As shown in FIG. 5, instead of shunting the first coil segment 52, a switch S2 is connected between the second coil segment 54 and the input to the first coil segment 52 to selectively remove the first coil segment 52 from the RF circuitry. Using the switch S2, there are two modes of operation. In the first mode, the first coil segment 52 and the second coil segment 54 are connected in series when the switch S2 is closed and the effects are similar to the FIG. 3 embodiment when the value of Ci is low. In the second mode, the first coil segment 52 is disconnected from the RF circuitry and the second coil segment 54 is connected in series with the RF circuit, when the switch S2 is open, the effect being similar to the FIG. 3 embodiment when the value of Ci is high.

The segmented TCP coil described in the embodiments above permits control of the plasma processing on different parts of the substrate undergoing treatment. For example, in plasma etching process, sufficient reduction of the center etch rate is obtained by reducing the current flowing through the first, i.e. inner coil segment. By controlling the etch rate on different parts of the wafer, a uniformly etched wafer surface can be obtained.

Figure 1:
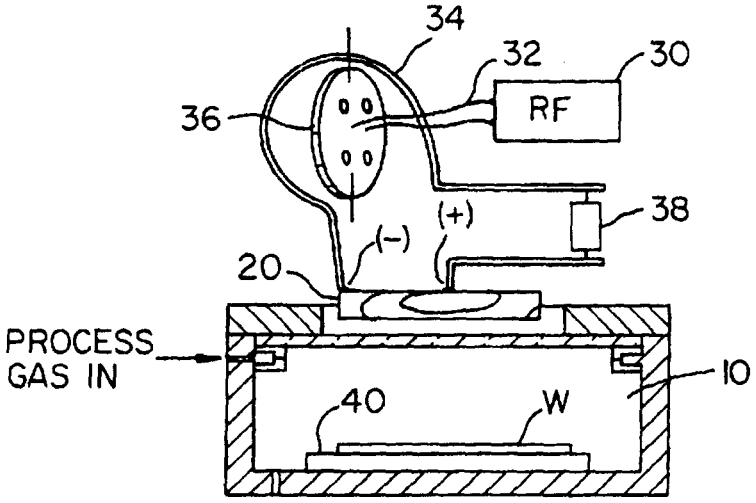
Figure 1 PRIOR ART
FIG. 1 is a schematic diagram of a plasma generating device employing a conventional single winding coil.
Figure 2:
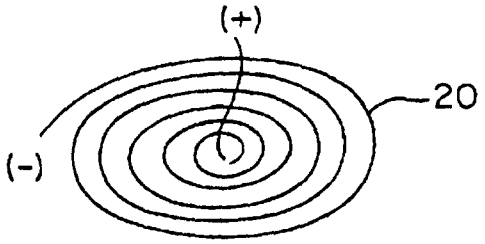
Figure 2 PRIOR ART
FIG. 2 is a perspective schematic view in detail of a conventional single winding monolithic coil.
Figure 6:
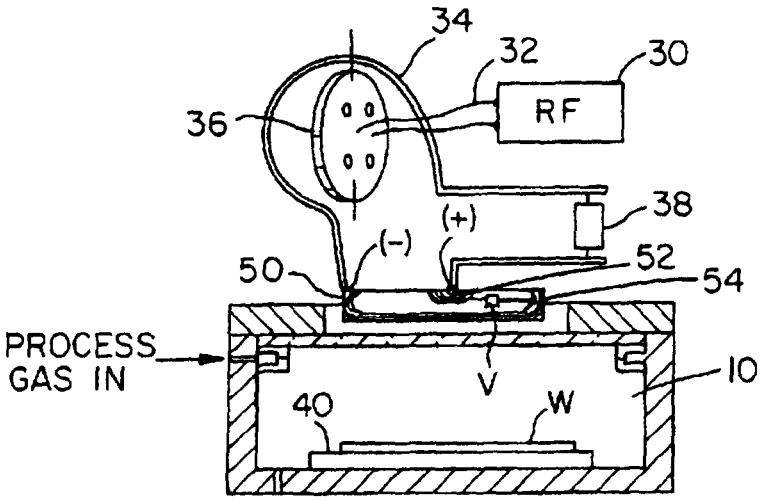
FIG. 6 is a schematic diagram of a plasma generating device employing a segmented coil according to the present invention.

A plasma generating device employing the segmented TCP coil is depicted in FIG. 6. Referring to FIG. 6, the segmented TCP coil 50 includes a first coil segment 52 and a second coil segment 54. A variable electrical component V may, for example, be an adjustable capacitor Ci or a switch S1 connected across the first coil segment 52, as shown in FIGS. 3 and 4, or a switch S2 connected between the first coil segment 52 and the second coil segment 54, as shown in FIG. 5. The segmented coil 50 is powered by a single RF source 30 connected via impedance matching circuitry and a tuning capacitor, as shown in FIG. 1. Alternatively, each of the coils is individually powered by different RF power sources and the coils can be arranged in non-concentric arrangements, e.g., the coils can be coplanar and arranged side-by-side in a row or pattern such as multiple rows of coils or randomly arranged coils.

The segmented TCP coil described above permits efficient generation of a spatially uniform plasma without changing the configuration of the TCP window or limiting the parameter ranges needed to optimize other processing responses. Although particular embodiments of the invention have been described, it will be appreciated by those of ordinary skill in the art that the present Invention can be embodied in other specific forms without departing from the spirit or essential characteristics thereof. For example, switches and capacitors can also be provided to shunt and/or disconnect the second coil as well as the first coil and three or more coils can be utilized to form the segmented coil. Furthermore, although a TCP segmented coil with coaxially arranged first and second coils has been illustrated, the number of coils is not hauled thereto, but may be any number and pattern which meets the demands of uniform plasma generation. The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. An apparatus for generating plasma, the apparatus comprising:

a plasma reaction chamber having a window forming a magnetic/electrical held path into the chamber and a process gas supply for introducing process gas into the chamber;

a coil comprising at least a first coil segment and a second coil segment, the first and second coil segments being connected in series and disposed proximate an exterior surface of the window of the chamber so electromagnetic fields from said first and second coil segments are coupled through the window into the chamber;

a radio frequency source for coupling r.f. energy to the coil [arrangement], the radio frequency source being effective to resonate a radio frequency current in the first and second [coils] *coil segments*; and a power distributing component connected to one of the coil segments fee controlling the flow of radio frequency current from the source through the first and second coil segments so different maximum radio frequency current amplitudes selectively flow from the source through the first and second coil segments at the same time to cause the process gas introduced into the chamber to be excited into a plasma having a relatively uniform plasma density in an area spanned by the first and second coil segments.

2. The apparatus of claim 1, wherein the power distributing component includes a circuit component connected in shunt with one of the coil segments.

3. The apparatus of claim 2, wherein the circuit component comprises an adjustable capacitor.

4. The apparatus of claim 2, wherein the circuit component comprises a switch for selectively effectively connecting one or both of the coil segments in series across a pair of excitation terminals connected to be responsive to radio frequency current derived from the radio frequency source.

5. The apparatus of claim 1, wherein the power distributing component includes a component for selectively disconnecting the first coil segment from the second coil segment so radio frequency current flows from the radio frequency source through the second coil segment but not through the first coil segment while the component disconnects the first coil segment from the second coil segment and radio frequency current flows from the radio frequency source through the first and second coil segments while the component connects the first coil segment to the second coil segment.

6. The apparatus of claim 5, wherein the component for selectively disconnecting comprises a switch.

7. The apparatus of claim 1, wherein the first and second coil segments are coplanar.

8. The apparatus of claim 1, wherein the first and second coil segments are concentrically arranged structures each including an inner terminal, an outer terminal and an arcuate conductor having at least one turn extending between the inner and outer terminals.

9. The apparatus of claim 1, wherein the first and second coil segments are powered by a single radio frequency power source, the first and second coil segments being connected to each other and the single radio frequency power source so radio frequency current flows from the radio frequency power source through a first excitation terminal of the coil connected to the first coil segment, thence through the coil to a second excitation terminal of the coil connected to the second coil segment, thence back to the source, the first and second excitation terminals being at opposite ends of the coil.

10. The apparatus of claim 1 wherein each of the coil segments includes an inner terminal, an outer terminal and an arcuate conductor portion having at least one turn extending between the inner and outer terminals, the first and second coil segments being connected in series across a pair of excitation terminals connected to be responsive to r.f current derived from the radio frequency source.

11. The apparatus of claim 10 wherein the exterior terminal of the first coil segment is connected to the interior terminal of the second coil segment.

12. The apparatus of claim 11 wherein the component is connected across the interior and exterior terminals of the first coil segment.

13. The apparatus of claim 12 wherein the first and second coil segments are concentric with each other.

14. The apparatus of claim 11 wherein the component includes a capacitor.

15. The apparatus of claim 13 wherein the component includes a switch for selectively causing (a) the first and second coil segments to be connected in series with each other while the switch is in a first position and (b) radio frequency current from the source not to flow in the first coil segment while the switch is in a second position.

16. The apparatus of claim 12 wherein the component includes a capacitor.

17. The apparatus of claim 12 wherein the component includes a switch for selectively causing (a) the first and second coil segments to be connected in series with each other while the switch is in a first position and (b) radio frequency current from the source not to flow in the first coil segment while the switch is in a second position.

18. The apparatus of claim 4 wherein the switch and coil segments are arranged so that (a) in a first position of the switch, radio frequency current from the radio frequency source flows in series through a first of the excitation terminals, thence in series through the first and second coil segments and thence through a second of the excitation terminals, and (b) in a second position of the switch, radio frequency current from the radio frequency source flows in series through the first excitation terminal, thence through one of the coil segments but not through the second of the coil segments and thence through the second excitation terminal.

19. The apparatus of claim 1, wherein the first and second coil segments are powered by a single radio frequency power source, the first and second coil segments being connected to each other and the single radio frequency power source so radio frequency current flows from the power source through a first excitation terminal of the coil connected to the first coil segment, thence through the first and second coil segments to a second excitation terminal of the coil connected to the second coil segment, thence back to the source, the first and second excitation terminals being at opposite ends of the coil.

20. A method of generating a plasma having a substantially uniform density in a plasma reaction chamber, the method comprising the steps of:

introducing a process gas into the plasma reaction chamber;

supplying an excitation coil for the plasma with a radio frequency current resonant to the coil, the coil responding to the radio frequency current to produce a radio frequency field that excites the gas to a plasma, the coil comprising at least a first coil segment and a second coil segment connected in a radio frequency circuit, the coil being disposed proximate an exterior surface of a window of the chamber; and selectively controlling the maximum amplitude of radio frequency current flowing through the first and second coil segments in a manner such that the plasma has a uniform plasma density in an area spanned by the first and second coil segments.

21. The method of claim 20, wherein the step of controlling the radio frequency maximum current amplitude is carried out by shunting one of the coil segments.

22. The method of claim 21, wherein the step of shunting is performed by causing a capacitor having a relatively high value to be connected in shunt with said one segment so substantial radio frequency current flows through the capacitor and a relatively low radio frequency current flows through said one segment.

23. The method of claim 21, wherein the step of shunting is performed by closing a switch across said one coil segment so the flow of the radio frequency current through said one coil segment is prevented.

24. The method of claim 20, wherein the step of controlling the radio frequency maximum current amplitude is carried out by disconnecting said one coil segment from the radio frequency circuit.

25. The method of claim 24, wherein the step of disconnecting is performed by opening a switch.

26. An apparatus for generating plasma, the apparatus comprising:

a plasma reaction chamber having a window forming a magnetic/electrical field path into the chamber and a process gas supply for introducing process gas into the chamber;

a radio frequency source arrangement; *and* a coil arrangement comprising a first coil segment and a second coil segment, the first and second coil segments being disposed proximate an exterior surface of the window of the chamber so radio frequency fields from said first and second coil segments are coupled through the window into the chamber, each of the coil segments including an inner terminal, an outer terminal and an arcuate conductor portion having at least one turn extending between the inner and outer terminals, the first coil segment being inside the second coil segment the first and second coil segments being connected to the radio frequency source arrangement and arranged so a lower radio frequency maximum amplitude current from the source arrangement flows through the first coil segment than through the second coil segment, the radio frequency fields derived from the first and second coil segments interacting with the process gas introduced into the chamber so the process gas is excited to form a plasma having a relatively uniform plasma density in an area spanned by the first and second coil segments.

27. The apparatus of claim [20] *26* wherein the coil arrangement for causing a lower radio frequency maximum amplitude current to flow through the first coil segment than through the second coil segment includes a relatively low non-inductive impedance shunting the first coil segment.

28. The apparatus of claim [20] *26* wherein the source arrangement includes a single radio frequency source, the first and second coil segments being connected in series across a pair of excitation terminals responsive to radio frequency current derived from the single radio frequency source, radio frequency current from the single source flowing through one of the excitation terminals, thence through both of the first and second coil segments, thence through the other excitation terminal.

29. A method of exciting plasmas in a plasma reaction chamber supplied with a process gas, the plasmas having differing characteristics at different times but being excited so they have substantially uniform density, the process gas being excited into a plasma by a coil coupling a radio frequency electromagnetic field into the chamber, the coil having spatially disparate plural segments relative to the excited plasma, the method comprising:

during a first interval while the excited plasma has a first characteristic, effectively arranging the segments in a first way and supplying radio frequency current to the coil so the radio frequency electromagnetic field coupled by the coil to the plasma has a first spatial configuration and amplitude to cause the plasma to have a first substantially uniform density[.]*; and* during a second interval white the excited plasma has a second characteristic, effectively arranging the segments in a second way and supplying radio frequency current to the coil so the radio frequency electromagnetic field coupled by the coil to the plasma has a second spatial configuration and amplitude to cause the plasma to have a second substantially uniform density, the first and second characteristics, ways, and configurations differing.

30. The method of claim 29 wherein in the first way, first and second of said segments are connected to each other and a source of radio frequency current so the same radio frequency current flows from the source to the first and second segments, and in the second way the first and second segments are connected to each other and a source of radio frequency current so different radio frequency currents flow from the source to the first and second segments.

31. The method of claim 30 wherein in the first way, the first and second segments are connected in series with each other and to the source of radio frequency current.

32. The method of claim 31 wherein in the second way the first segment is connected to the source of radio frequency current and the second segment is arranged so current from the source of radio frequency current does not flow in the second segment.

33. The method of claim 31 wherein in the second way, the first and second segments are connected in series with each other and to the source of radio frequency current and an impedance is connected in shunt with the second segment.

34. The method of claim 33 further including changing the impedance so it has first and second values to provide the first and second ways, respectively.

35. The method of claim 29 wherein the first and second ways are respectively achieved by first and second settings of a component connected to a first of the segments.

36. The method of claim 35 wherein the component includes a switch, the switch when activated to the first setting connecting the first segment in series with a second of the segments so the radio frequency current flowing through the first segment flows in the second segment, the switch when activated to the second setting causing a finite non-zero radio frequency current to flow from the source through the first segment and no radio frequency current to flow from the source through the second segment.

37. The method of claim 35 wherein the component includes a non-inductive impedance connected in series with a first of the segments and shunting a second of the segments, the impedance respectively having first and second values when the component is activated to the first and second settings.

38. The method of claim 29 wherein first and second of the segments are series connected to each other and the first and second ways are respectively achieved by first and second settings of a component connected to the first segment, the component when activated to the first setting causing radio frequency current flowing through the first and second segments to have a first relation with respect to each other, the component when activated to the second setting causing radio frequency current flowing through the first and second segments to have a second relation with respect to each other.

*39. The apparatus of claim 1, wherein the first coil segment and the second coil segment are arranged as an inner coil segment and an outer coil segment, respectively, of the coil.*

*40. The apparatus of claim 1, wherein at least one of the first and second coil segments has a plurality of radially and circumferentially extending turns.*

*41. The apparatus of claim 1, wherein both of the first and second coil segments have a plurality of radially and circumferentially extending turns.*

*42. The apparatus of claim 41, wherein the first and second coil segments are connected in series by the power distributing component.*

*43. The apparatus of claim 42, wherein the power distributing component is configured as a loop lacking a plurality of radially and circumferentially extending turns.*

*44. The apparatus of claim 43, wherein the apparatus is configured such that resultant magnetic flux densities in the vicinity of first and second coil segments are greater than resultant magnetic flux density in the vicinity of the power distributing component.*

*45. The apparatus of claim 26, wherein the arcuate conductor of at least one of the first and second coil segments has a plurality of radially and circumferentially extending turns.*

*46. The apparatus of claim 26, wherein the arcuate conductors of the first and second coil segments have a plurality of radially and circumferentially extending turns.*

*47. The apparatus of claim 46, wherein the coil arrangement further comprises a power distributing component connected in series between the first coil segment and the second coil segment.*

*48. The apparatus of claim 47, wherein the power distributing component is configured as a loop lacking a plurality of radially and circumferentially extending turns.*

*49. The apparatus of claim 48, wherein the apparatus is configured such that the coil arrangement is associated with a plurality of resultant magnetic flux densities, wherein resultant magnetic flux densities in the vicinity of first and second coil segments are greater than resultant magnetic flux density in the vicinity of the power distributing component.*

*50. An apparatus for generating plasma, the apparatus comprising:*

*a plasma reaction chamber having a window forming a magnetic/electrical field path into the chamber and a process gas supply for introducing process gas into the chamber;*

*a coil comprising at least an inner coil segment and an outer coil segment, the inner and outer coil segments being connected in series and disposed proximate an exterior surface of the window of the chamber so electromagnetic fields from said inner and outer coil segments are coupled through the window into the chamber;*

*a radio frequency source for coupling r.f. energy to the coil, the radio frequency source being effective to resonate a radio frequency current in the inner and outer coil segments; and*

*a power distributing component connected to one of the coil segments for controlling the flow of radio frequency current from the source through the inner and outer coil segments so different maximum radio frequency current amplitudes selectively flow from the source through the inner and outer coil segments at the same time to cause the process gas introduced into the chamber to be excited into a plasma having a relatively uniform plasma density in an area spanned by the inner and outer coil segments.*

*51. The apparatus of claim 50, wherein the power distributing component includes a circuit component connected in shunt with one of the inner or outer coil segments.*

*52. The apparatus of claim 51, wherein the circuit component comprises an adjustable capacitor.*

*53. The apparatus of claim 51, wherein the circuit component comprises a switch for selectively effectively connecting one or both of the inner and outer coil segments in series across a pair of excitation terminals connected to be responsive to radio frequency current derived from the radio frequency source.*

*54. The apparatus of claim 50, wherein the power distributing component includes a component for selectively disconnecting the inner coil segment from the outer coil segment so radio frequency current flows from the radio frequency source through the outer coil segment but not through the inner coil segment while the component disconnects the inner coil segment from the outer coil segment and radio frequency current flows from the radio frequency source through the inner and outer coil segments while the component connects the inner coil segment to the outer coil segment.*

*55. The apparatus of claim 50, wherein the inner and outer coil segments are coplanar.*

*56. The apparatus of claim 50, wherein the inner and outer coil segments are concentrically arranged structures each including an inner terminal, an outer terminal and an arcuate conductor having at least one turn extending between the inner and outer terminals.*

*57. The apparatus of claim 50, wherein the inner and outer coil segments are powered by a single radio frequency power source, the inner and outer coil segments being connected to each other and the single radio frequency power source so radio frequency current flows from the radio frequency power source through a first excitation terminal of the coil connected to the inner coil segment, thence through the coil to a second excitation terminal of the coil connected to the outer*

*coil segment, thence back to the source, the first and second excitation terminals being at opposite ends of the coil.*

*58. The apparatus of claim 50 wherein each of the inner and outer coil segments includes an inner terminal, an outer terminal and an arcuate conductor portion having at least one turn extending between the inner and outer terminals, the inner and outer coil segments being connected in series across a pair of excitation terminals connected to be responsive to r.f current derived from the radio frequency source.*

* * * * *